United States Patent [19]

Nakano et al.

[11] Patent Number: 4,611,122
[45] Date of Patent: Sep. 9, 1986

[54] SIGNAL DETECTION APPARATUS WITH PLURAL ELONGATE BEAMS CORRESPONDING

[75] Inventors: Shigeki Nakano, Tokyo; Masao Totsuka, Ohmiya, both of Japan

[73] Assignee: Canon Kabushiki Kaisha, Tokyo, Japan

[21] Appl. No.: 554,630

[22] Filed: Nov. 23, 1983

[30] Foreign Application Priority Data

Nov. 29, 1982 [JP] Japan .................................. 57-208764

[51] Int. Cl.⁴ ............................................ G01N 21/86
[52] U.S. Cl. ..................................... 250/548; 356/401
[58] Field of Search ................... 250/548, 557, 237 R, 250/225; 356/399, 400, 401

[56] References Cited

U.S. PATENT DOCUMENTS

| | | | |
|---|---|---|---|
| 3,683,195 | 8/1972 | Johannsmeier et al. | 250/219 |
| 3,865,483 | 2/1975 | Wojcik | 250/548 |
| 4,167,677 | 9/1979 | Suzki | 356/401 |
| 4,202,627 | 5/1980 | Suzki | 356/401 |
| 4,301,363 | 11/1981 | Suzuki et al. | 250/548 |
| 4,515,481 | 5/1985 | Yamada et al. | 250/557 |

Primary Examiner—David C. Nelms
Assistant Examiner—James G. Gatto
Attorney, Agent, or Firm—Fitzpatrick, Cella, Harper & Scinto

[57] ABSTRACT

A signal detection apparatus comprises a device for forming with separable lights illumination areas extending in different plural directions, a scanner for causing the illumination areas to scan bar-like marks extending in different directions on an object, and a photoreceptor for separately receiving signal lights corresponding to the respective different directions from the rays reflected by the marks.

15 Claims, 11 Drawing Figures

SIGNAL DETECTION APPARATUS WITH PLURAL ELONGATE BEAMS CORRESPONDING

BACKGROUND OF THE INVENTION

1. Field of the Invention

The present invention relates to an apparatus for detecting the position of an object. More particularly, the present invention relates to an apparatus for detecting signals used to align two objects such as a mask and wafer in a semiconductor exposure system and the like.

2. Description of the Prior Art

In the prior art systems for aligning the mask and wafer with each other, the mask and wafer respectively having alignment marks thereon are disposed one above the other on a plane to be scanned and then scanned by the use of light to detect time intervals between the alignment marks, the time intervals being used to detect the positional relationship between the alignment marks.

With reference to FIG. 1, an alignment mark on a mask includes first and second alignment mark elements M1 and M2 parallel to each other on a scanning line A, and third and fourth alignment mark elements M3 and M4 parallel to each other on the same scanning line A and oppositely inclined relative to the scanning line A, all of which elements are inclined relative to the scanning line A by an angle $\theta$ of 45 degrees, as shown in FIG. 1(a). An alignment mark on a wafer includes first and second alignment mark elements W1 and W2 which are inclined oppositely relative to each other and also relative to the scanning line A by an angle $\theta$ of 45 degrees, respectively, as shown in FIG. 1(b). The alignment of the mask and wafer relative to each other will be carried out by overlapping the alignment marks one above the other as shown in FIG. 1(c).

U.S. Pat. No. 3,683,195 discloses an apparatus for scanning such alignment marks along the scanning line A by the use of an optical scanning mechanism which includes movable slit-like openings spaced apart from each other and extending in two different directions. One of the slit-like openings is used to detect the positional relationship, for example, among the marks M1, W1 and M2, while the other slit-like opening is utilized to detect the positional relationship among the remaining marks M3, W2 and M4. However, the prior art optical apparatus is disadvantageous in that it is essential to provide a plurality of slits resulting in a plurality of optical systems. There is also a problem that the detection light is less effectively utilized since it will illuminate the entire area to be observed with only part thereof devoted to detection.

U.S. Pat. No. 4,167,677 discloses a detection apparatus for scanning the surface of an object by the use of a light spot. The detection apparatus of this patent is disadvantageous in that if any foreign matter is on the scanning line or if a part of the alignment mark is broken off, there will occur failure in alignment or deterioration of detection accuracy. U.S. patent application Ser. No. 438,638 filed 11-3-82 discloses a detection apparatus which scans the alignment marks by the use of a bar-like beam inclined to conform to the orientation of one of the alignment marks, the inclination of the bar-like beam being changed to conform the orientation of the other alignment mark between the first and second scannings. The detection apparatus of this U.S. patent application requires a complicated changing mechanism with high accuracy and a prolonged period of time for alignment measurement.

SUMMARY OF THE INVENTION

It is an object of the present invention to overcome the above disadvantages and to provide an apparatus for detecting alignment signals used to detect the alignment of two objects in accordance with the aligned marks thereon more effectively with higher accuracy.

These and other objects, features and advantages of the present invention will become more apparent upon a consideration of the following description of the preferred embodiment of the present invention taken in conjunction with the accompanying drawings.

The present invention provides an apparatus for optically scanning two or more slit-like alignment marks extending in different inclined directions, said apparatus being characterized by illumination means forming a scanning beam having a cross-section of a cross whose orientations are conformed to the orientations of both the marks while at the same time crossing components are separable slit-like lights, and means for separately detecting the reflected and scattered lights from the marks scanned by the illumination means for each orientation.

DESCRIPTION OF THE PREFERRED EMBODIMENTS

The present invention will now be described in more detail with reference to embodiments thereof illustrated in FIGS. 2 through 6.

Figure 1A:
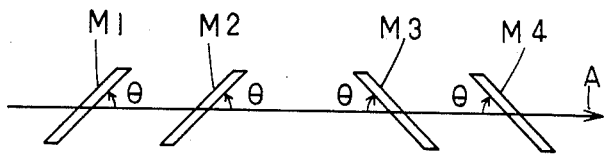
FIGS. 1a to 1c illustrate the prior art detection of alignment marks.
Figure 1B:
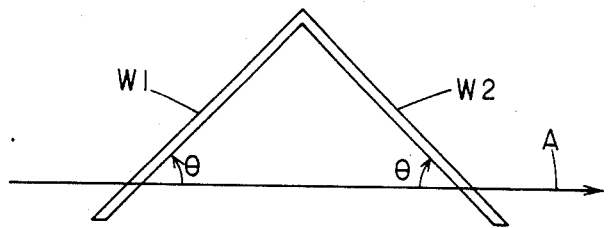
Figure 1C:
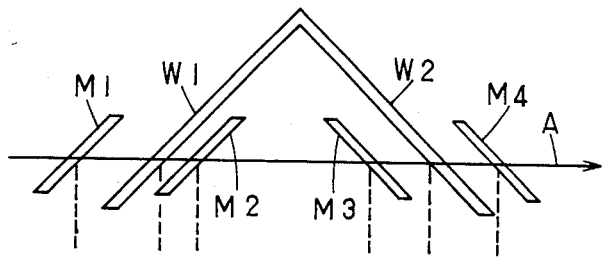
Figure 2:
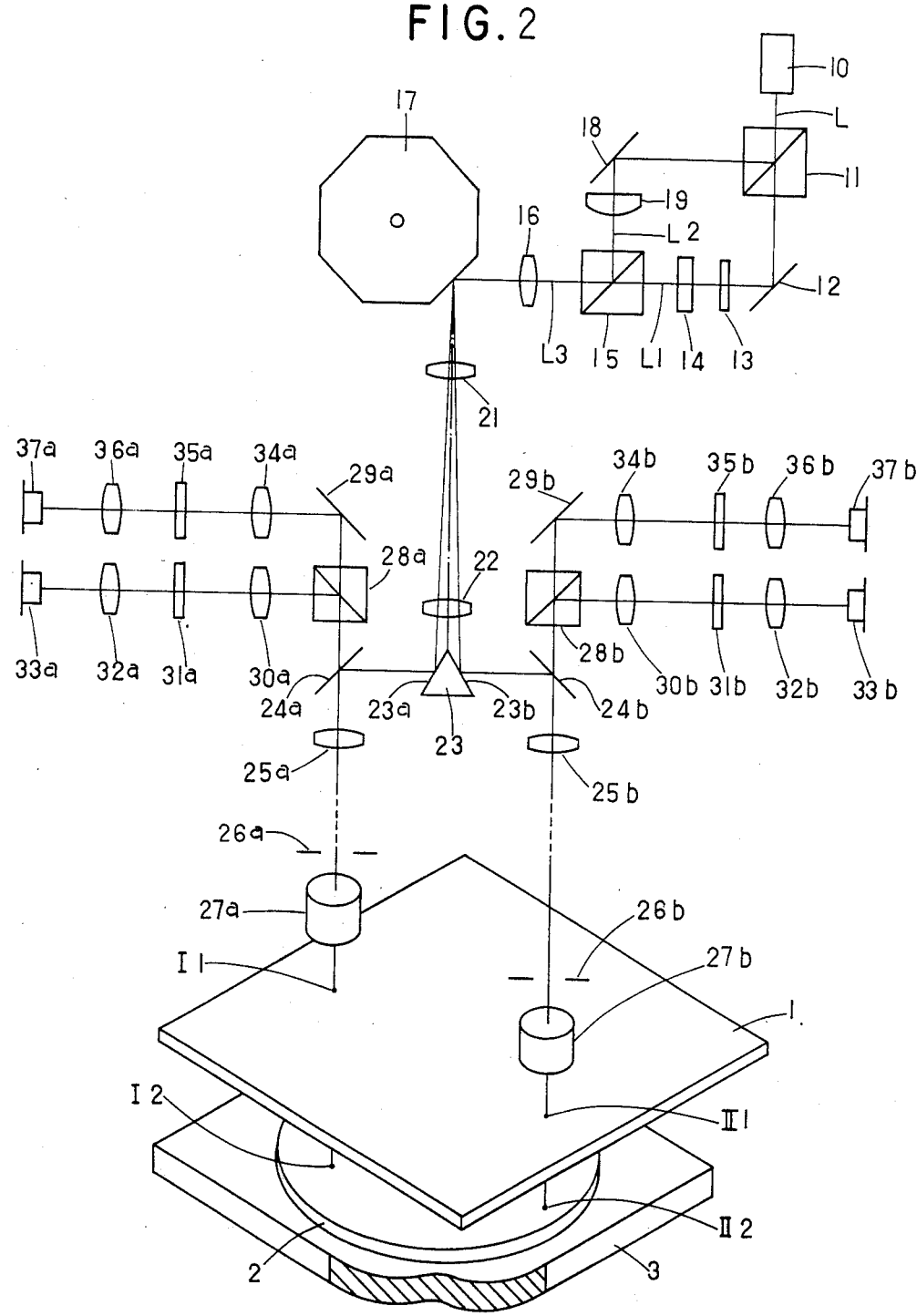
FIG. 2 is a schematic diagram of an optical system used in an alignment-signal detection apparatus according to the present invention.

FIG. 2 shows an optical system in an alignment-signal detection apparatus. In this Figure, reference numeral 1 denotes a mask and reference numeral 2 designates a wafer which is placed on a wafer stage 3. The mask 1 and wafer 2 include alignment marks as shown in FIGS. 1(a) and 1(b), respectively. These alignment marks are overlapped one above the other as shown in FIG. 1(c).

The optical system comprises a source 10 of a visible or invisible laser beam which emits a laser beam L. Along the path of this laser beam L, there are disposed a half-mirror 11, a reflection mirror 12, a $\lambda/2$ plate 13, a first cylindrical lens 14 having its axis inclined relative to the plane of the drawing by an angle of 45 degrees, a first polarization beam splitter 15 capable of transmitting the P-polarized light and reflecting the S-polarized light, an imaging lens 16 and a rotary polygonal mirror 17 in the order as described. Another reflection mirror 18 is located opposed to the half-mirror 11 such that the beam reflected by the mirror 18 will be incident on the first polarization beam splitter 15 through a second cylindrical lens 19 which has its converging axis intersecting the axis of the first cylindrical lens 14 at right angle. Along the optical axis of the laser beam L scanningly deflected by the rotary polygonal mirror 17, there are further disposed intermediate lenses 21 and 22, and a prism 23 for deflecting the laser beam L in two perpendicular directions depending on the incident angle of the laser beam. The prism 23 is also located between two optical systems arranged symmetrically relative to the prism 23. Each of these symmetrically disposed optical systems includes a half-mirror (24a; 24b) for further deflecting the laser beam L deflected by the prism 23 and for conducting the reflection light to a photoelectric detection optical system in the return, an intermediate lens (25a; 25b), an aperture (26a; 26b), and an objective lens (27a; 27b) in the order described.

On the optical path for the light separated and transmitted by each of the half-mirrors 24a and 24b in the return, there are disposed a second or third polarization beam splitter 28a or 28b and a reflection mirror 29a or 29b. A photoelectric detection system is positioned opposed to each of the polarization beam splitters 28a and 28b while a similar system is located opposed to each of the reflection mirrors 29a and 29b. Each of the second and third polarization beam splitters 28a and 28b functions to transmit the P-polarized light and to reflect the S-polarized light, as in the aforementioned polarization beam splitter 15. Between each of the second and third polarization beam splitters 28a and 28b and the corresponding photoelectric detection system, there are disposed an imaging lens (30a; 30b), a partial light blocking plate (31a; 31b), a condenser lens (32a; 32b) and a photoelectric converter (33a; 33b). Between each of the reflection mirrors 29a and 29b and the corresponding photoelectric detection system, there are located an imaging lens (34a; 34b), a partial light blocking plate (35a; 35b), a condenser lens (36a; 36b) and a photoelectric converter (37a and 37b).

Figures 3A, 3B:
FIGS. 3a and 3b are front views of light blocking plates.

Each of the partial light blocking plates 31a and 31b includes a central solid portion and slit-like transmissive portions 38 opposed to each other diametrically as shown in FIG. 3(a). On the other hand, as illustrated in FIG. 3(b), each of the partial light blocking plates 35a and 35b includes a similar central solid portion but slit-like transmissive portions 39 located opposed to each other in a diametric direction perpendicular to the diametric line on which the slit-like light blocking portions 38 are disposed.

Each of the polarization beam splitters may be replaced by a half-mirror and a polarizer may be disposed in each of the split optical paths.

Figure 4A:
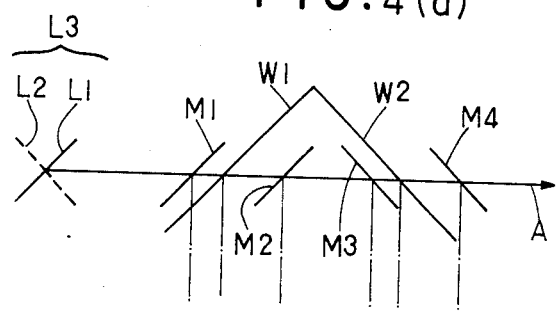
FIGS. 4a to 4c illustrate the operation of the apparatus according to the present invention.

In the above arrangement of the present invention, if the laser beam L emitted from the source of laser beam 10 is S-polarized light, it is divided by the half-mirror 11 into two beam sections which are incident on and deflected by the reflection mirrors 12 and 18, respectively. The laser beam section reflected by the reflection mirror 12 is converted by the λ/2 plate 13 into a P-polarized light and then converted by the first cylindrical lens 14 into a bar-like beam L1 which is in turn incident on the first polarization beam splitter 15 and transmits the same. On the other hand, the S-polarized beam section reflected by the reflection mirror 18 is converted by the second cylindrical lens 19 into a bar-like beam L2 which extends in the direction perpendicular to the direction of the beam L1 and which is in turn incident on the first polarization beam splitter 15. The beam L2 is reflected by the first polarization beam splitter 15 so that it will be mixed with the beam L1 to form a bar-like beam L3 in which the P- and S-polarized beams intersect. The bar-like beam L3 is incident on the rotary polygonal mirror 17 through the imaging lens 16 and scanningly deflected by the same. After the beam L3 has been scanningly deflected by the rotary polygonal mirror 17, it is then incident on, for example, a left side 23a of the prism 23 through the intermediate lenses 21 and 22. The beam L3 is deflected by the prism 23 leftwardly and further deflected by the half-mirror 24a downwardly. Thereafter, the beam L3 is imaged on the mask 1 and the wafer 2 through the intermediate lens 25a, the aperture 26a and the objective lens 27a. As shown in FIG. 4(a), the beam L3 imaged on the mask 1 and the wafer 2 is thus composed of the P-polarized beam L1 which forms a bar-like illumination area parallel to the alignment marks M1, W1 and M2 and the S-polarized beam L2 which forms a bar-like illumination area parallel to the alignment marks M3, W2 and M4. First groups of alignment marks I1 and I2 respectively formed on the mask 1 and wafer 2 are thus irradiated by the beam L3.

Figure 4B:
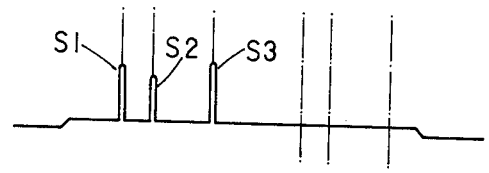

Under such an arrangement, if the composite beam L3 is scanningly deflected rightwardly along the scanning line A (FIG. 4(a)), a scattering will first occur at positions corresponding to the alignment marks M1, W1 and M2. Output signals S1, S2 and S3 shown in FIG. 4(b) are obtained when the scattered and reflected light of the P-polarized beam L1 at the alignment marks M1, W1 and M2 is returned through the objective lens 27a, aperture 26a and intermediate lens 25a shown in FIG. 2, is then transmitted to the second polarization beam splitter 28a, thereafter is reflected by the reflection mirror 29a and finally is incident on the photoelectric detection converter 37a through the imaging lens 34a, partial light blocking plate 35a and condenser lens 36a. In this case, the beam L1 is of an inclined bar shape and detected in such a condition that it substantially conforms with the alignment marks M1, W1 and M2. Consequently, the sensitivity and accuracy of detection will be improved in comparison with the spot-like beam as in the prior art.

The S-polarized beam L2 also is scattered and reflected at intersections between this beam and the respective alignment marks M1, W1 and M2. This scattered and reflected light is returned to and reflected by the beam splitter 28a. Since the level of the scattered and reflected light is low, however, the resulting output signals from the photoelectric detection converter 33a are cut for convenience in the waveform processing. During this, the non-scattered light reflected by the smooth surfaces of the mask and wafer 1, 2 is imaged on the central solid portions of the respective partial light blocking plates 31a and 35a such that the light will not reach the photoelectric converter 33a and 37a.

Figure 4C:
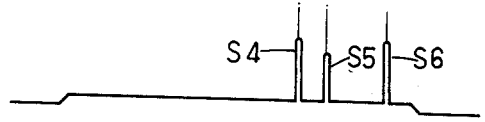
Figure 5:
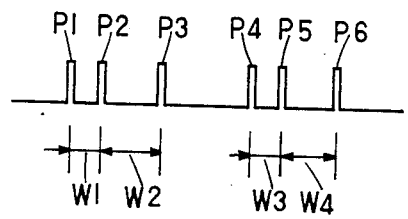
FIG. 5 shows the relationship between pulses and time intervals.

If the beam L3 is further scanningly deflected rightwardly, the S-polarized beam L2 inclined in the same direction as those of the alignment marks M3, W2 and M4 will provide output signals S4, S5 and S6 from the photoelectric converter 33a as shown in FIG. 4(c). The output signals S1 to S6 are shaped by a waveform shaping circuit (not shown) to provide time intervals w1, w2, w3 and w4 between the output signals, as shown in FIG. 5. In accordance with these time intervals, positional deviations $\Delta X$ and $\Delta Y$ between the first groups of alignment marks I1 and I2 are determined by the use of the following formulae:

Deviation $\Delta X$ in the X-direction $= (w1 + w2 - w3 - w4)/4$; and

Deviation ΔY in the Y-direction $= (-w1+w2-w3+w4)/4$.

In this manner, the first groups of alignment marks I1 and I2 can completely be detected in accordance with the output signals S1 to S6 from the photoelectric detection converters 33a and 37a as shown in FIGS. 4(b) and 4(c).

When the beam L3 is further deflected and then reaches the right side 23b of the prism 23, the beam L3 is deflected by the prism 23 rightwardly and forms second groups of alignment marks II1 and II2 on the mask and wafer 1, 2 through the intermediate lens 25b, aperture 26b and objective lens 27b. The second groups of alignment marks II1 and II2 will be detected and used to determine deviations ΔX' and ΔY' in both the X- and Y-directions in the same manner as that previously described with respect to the first groups of alignment marks I1 and I2. In accordance with these deviations, movements in the X-, Y- and θ-directions can be determined as follows;

$X=(\Delta X+\Delta X')/2$, $Y=(\Delta Y+\Delta Y')/2$ and $\theta=\tan^{-1}(\Delta Y-\Delta Y')/L$ where L is a distance between the first and second groups of alignment marks. Thus, if the mask or wafer is moved by X, Y and θ, a proper alignment will be attained.

Figure 6:
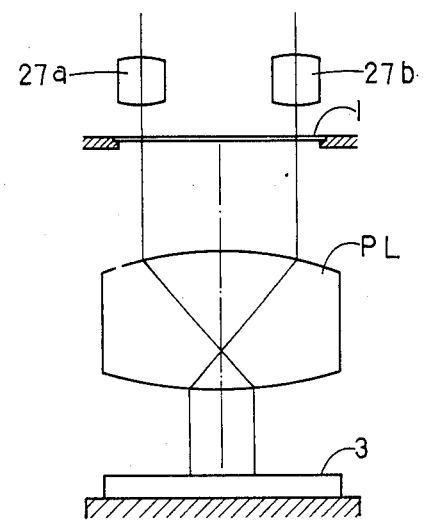
FIG. 6 is a partial cross section of the main part of a modification according to the present invention.

Although the present invention has been described as to such an embodiment that the intersecting P-and S-polarized beams L1 and L2 are separately discriminated by the respective photoelectric detection optical systems, the other separation means, for example, means for separately discriminating scattered by reflected lights having different wavelengths may be adopted. In this case, the source of light 10 is replaced by a source of multi-wavelength light while the half-mirror 11 and the polarization beam splitters 28a and 28b are substituted by dichroic mirrors. It is also understood that the present invention can effectively be applied to a projection type automatic alignment apparatus including a projection optical system PL located between the mask 1 and the wafer 2 as shown in FIG. 6.

As will be seen from the foregoing, the alignment-signal detection apparatus according to the present invention is advantageous in that the alignment marks can be detected at higher speed with higher accuracy because of the fact that alignment marks inclined with different angles are two intersecting slit-like lights which are separable from each other and have different physical properties.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for detecting light signals from first and second marks extending in different directions on an object, the apparatus comprising:
   means for forming, with beams having different properties, illumination areas extending in different directions corresponding to the different directions in which the marks extend;
   means for illuminating the first and second marks with both of the illumination areas; and
   means for separately receiving components of light from the marks on the basis of the difference in the properties of the beams.

2. An apparatus as defined in claim 1 wherein the beams having different properties are light beams different in polarization direction from each other.

3. An apparatus as defined in claim 1 wherein the beams having different properties are beams different in wavelength from each other.

4. An apparatus as defined in claim 1, further including a radiation sensitive member located near said object.

5. An apparatus as defined in claim 1, further including a projection optical system for projecting the image of said object and a radiation receiving member for receiving the projected image of said object.

6. An apparatus as defined in claim 1 wherein said object includes first and second bar-like marks extending in different directions.

7. An apparatus as defined in claim 4 wherein said object is a mask.

8. An apparatus for detecting misalignment between a mask having a bar-like mark and a wafer having a bar-like mark corresponding to the bar-like mark on the mask, the apparatus comprising:
   means for producing a first beam;
   means for splitting the first beam into second and third beams having different properties;
   means for reforming the second and third beams so as to provide illumination areas extending in different directions;
   means for combining the second and third beams;
   means for illuminating the marks on the mask and the wafer with the combined beam;
   means for selecting components of light from the marks on the basis of the difference in the properties of the beam; and
   means for receiving the selected light.

9. An apparatus as defined in claim 8 wherein the first beam is a laser beam linearly polarized and wherein said splitting means includes a beam splitter and a λ/2 plate.

10. An apparatus as defined in claim 8 wherein said reforming means includes an anamorphic optical element.

11. An apparatus as defined in claim 8 wherein said selecting means is a polarization beam splitter.

12. An apparatus as defined in claim 8, further including a projection optical system for projecting the image of said mask on said wafer.

13. An apparatus as defined in claim 5 wherein said object is a mask.

14. An apparatus as defined in claim 6 wherein said object is mask.

15. A method of detecting light signals from first and second marks extending in different directions on an object, the method comprising the steps of:
   forming, with beams having different properties, illumination areas extending in different directions corresponding to the different directions in which the marks extend;
   illuminating the first and second marks with both of the illumination areas; and
   separately receiving components of light from the marks on the basis of the difference in the properties of the beams.

* * * * *